United States Patent [19]
Ranmuthu

[11] Patent Number: 6,157,256
[45] Date of Patent: Dec. 5, 2000

[54] SYSTEM FOR HIGH BANDWIDTH SIGNAL AMPLIFICATION

[75] Inventor: Indumini Ranmuthu, Plano, Tex.

[73] Assignee: Texas Instruments Incorporated, Dallas, Tex.

[21] Appl. No.: 09/282,884

[22] Filed: Mar. 31, 1999

Related U.S. Application Data

[60] Provisional application No. 60/117,198, Jan. 26, 1999, and provisional application No. 60/080,801, Apr. 6, 1998.

[51] Int. Cl.[7] ........................................................ H03F 3/45
[52] U.S. Cl. ............................. 330/252; 330/311; 330/51; 327/561
[58] Field of Search .................................... 330/252, 292, 330/311, 147, 69, 51; 327/561, 563

[56] References Cited

U.S. PATENT DOCUMENTS

| | | | |
|---|---|---|---|
| 3,890,553 | 6/1975 | Diamond | 318/678 |
| 4,760,346 | 7/1988 | Kultgen et al. | 330/69 |
| 5,352,987 | 10/1994 | Harvey | 330/51 |
| 5,457,425 | 10/1995 | Tahara | 330/51 |
| 5,559,470 | 9/1996 | Laber et al. | 330/252 |
| 5,596,299 | 1/1997 | Persico et al. | 330/260 |
| 5,838,197 | 11/1998 | Tsukuda | 330/252 |
| 5,896,062 | 4/1999 | Tiller et al. | 330/252 |
| 5,936,475 | 1/2000 | Tchamov et al. | 331/57 |
| 6,016,077 | 1/2000 | Ranmuthu et al. | 330/252 |

*Primary Examiner*—Robert Pascal
*Assistant Examiner*—Henry Choe
*Attorney, Agent, or Firm*—W. Daniel Swayze, Jr.; Wade James Brady, III; Frederick J. Telecky, Jr.

[57] ABSTRACT

A method and circuitry are disclosed for enhancing the operational bandwidth of a signal amplification circuitry system; for example, comprising providing an amplification circuit for amplifying the electrical signal, providing buffer circuitry adapted to negate capacitive loading effects between amplifier stages, and coupling said buffer circuitry between the amplification circuitry and collateral circuitry such that the buffer circuitry isolates the amplification circuitry from the effects of capacitive loading originating from the collateral circuitry. Enhancement in the operational bandwidth of the amplification circuit results. A plurality of buffer circuit elements 162 and 352 are coupled within amplifier stages 100, 200, and 300 negating the transitive effects of capacitive loading between the amplifier stages. The isolative nature of the buffer circuits results in an overall improvement of the operational bandwidth of the amplifier circuitry, providing the advantage of improved overall performance of the amplifier.

15 Claims, 3 Drawing Sheets

SYSTEM FOR HIGH BANDWIDTH SIGNAL AMPLIFICATION

This application claims priority under 35 U.S.C. § 119 (e)(1) of provisional application Serial No. 60/117,198, filed Jan. 26, 1999, and provisional application Serial No. 60/080,801 filed Apr. 6, 1998.

TECHNICAL FIELD OF THE INVENTION

The present invention relates generally to circuitry for signal amplification and, more particularly, to providing enhanced bandwidth performance in high performance amplifier circuitry, such as in mass storage devices.

BACKGROUND OF THE INVENTION

Circuitry performing high frequency signal amplification is used extensively in modern electronics. Very often these amplification circuits, or amplifiers, are interposed between a first device that reads or senses a very minute electrical signal and a second device requiring a larger signal.

Conventional methods of signal amplification typically employ one or more stages of circuitry in which a signal is introduced into the circuitry, conducted through one or more gain stages to amplify the signal, and finally output from the circuitry in its amplified form.

As performance and efficiency demands of electronic devices are increased, amplifier circuitry can be optimized to perform with desired operational characteristics. One such characteristic is the operational bandwidth of the amplifier. Operational bandwidth is directly related to other performance characteristics of an amplifier circuit, such as frequency response of the circuit.

SUMMARY OF THE INVENTION

In some applications, optimizing these performance characteristics is essential to the overall efficiency and success of the system. Operational bandwidth of an amplifier circuit may be affected by various factors. One factor affecting the operational bandwidth of an amplifier circuit is capacitive loading within the amplifier circuit. Capacitive loading effects an alteration of a dominant pole in the amplifier circuit, resulting in a modification of the operational bandwidth of the amplifier circuit.

Apparently, a significant source of capacitive loading within amplifier circuits is Miller-effect capacitance. Miller-effect capacitance of collateral circuitry stages, preceding and subsequent, transitively loads an amplifier circuit resulting in a reduced operational bandwidth of the amplifier.

Many amplifier circuit systems employ multiple stages of amplifier circuitry. The cumulative effects of Miller-effect capacitance, throughout an entire amplifier circuit system, are thus amplified and result in an overall, and often significant, reduction in operational bandwidth of that amplifier circuit system.

Many advanced systems use input from multiple sensing devices which are individually-selectable. The stray capacitances of the sensing devices are extremely small, and have heretofore been generally regarded at negligible. We have discovered that such stray capacitances are now becoming important. The use of multiple input sensors significantly increases the capacitance, even when the sensors are selected one at a time, possibly due to the capacitance of the selection circuitry. We have found that, for example, the use of multiple sensors, in combination with operational speeds of in the range of a half-gigahertz or more, and conventional amplifiers, limits the bandwidth of such advanced systems.

One example of such a system is amplification circuitry employed in mass storage device (e.g. hard disk drive) "pre-amp" circuits. Modern mass storage devices may comprise multiple read head assemblies; which transfer signals stored on the storage media via, and serve as signal inputs for, the "pre-amp" circuitry. The cumulative effect of capacitive loading across the multiple read head assemblies significantly reduces the operational bandwidth of the amplifier circuitry; negatively impacting the overall performance of the mass storage device.

A consideration in designing amplifier circuitry systems is the utilization and optimization of circuitry to inhibit the negative effects of Miller-effect capacitance.

Methods may be employed that, while providing some relief from Miller-effect capacitance, negatively impact other performance characteristics of the amplifier system. Based on the complexity and nature of the amplifier circuit, various options for modifying the capacitive loading of the amplifier circuit exist. Conventional methods for modifying capacitive loading within amplifier circuitry present problems, especially in the case of specialized function amplifier circuits. Conventional methods for modifying capacitive loading may introduce noise and instability to the electrical signal being amplified.

Other methods, although providing incremental improvements in operational bandwidth, result in less than optimal overall bandwidth performance.

It is thereby desirable to provide an amplifier circuitry system that negates the effect of Miller-effect capacitance; allowing enhanced operational bandwidth without negatively impacting other performance characteristics of the amplifier system.

The present invention overcomes the aforementioned limitations of current methods by a system that provides buffer circuitry optimized within the amplification circuitry system; isolating Miller-effect capacitance, and optimizing gain of the amplifier circuitry while reducing noise and instability in the signal.

The invention provides a method of creating a signal amplification circuit having enhanced bandwidth and circuitry incorporating this method. An amplification circuit is provided. Buffer circuitry is coupled between the amplification circuit and a collateral circuit. The buffer circuitry is adapted to isolate the amplification circuit from capacitive loading originating or transferring from the collateral circuit. The combined circuitry eliminates the effect of Miller capacitance in the amplification circuitry, resulting in an enhanced operational bandwidth of the amplifier circuitry.

More particularly, input circuitry is inter-coupled with amplifier circuitry to form buffer circuitry. Alternatively, buffer circuitry is interposed between the input and amplifier circuitry. The input circuitry is preferably adapted to selectably receive one of a plurality of electrical signals. Buffer circuitry is interposed between output circuitry and amplifier circuitry. Where multiple amplifier circuit stages are employed, buffer circuitry is interposed between the amplifier circuitry stages.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts, and in which.

DETAILED DESCRIPTION OF THE PRESENT INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention allows for an amplifier circuitry system having high operational bandwidth. Buffer circuitry is adapted within the amplifier circuitry system such that capacitive loading effects are negated, and thus do not alter a dominant pole of the amplifier circuit. This negation of capacitive loading effects within the amplifier circuitry system results in an overall enhancement in operational bandwidth of the amplifier circuit.

As will be apparent to one skilled in the art, the present invention may be employed using a number of buffer circuitry implementations and operational amplifier circuits. The underlying principles of this invention are applicable, and its implementations readily adaptable, in a wide range of signal amplification applications. All such embodiments are comprehended by the present invention.

Figure 1:
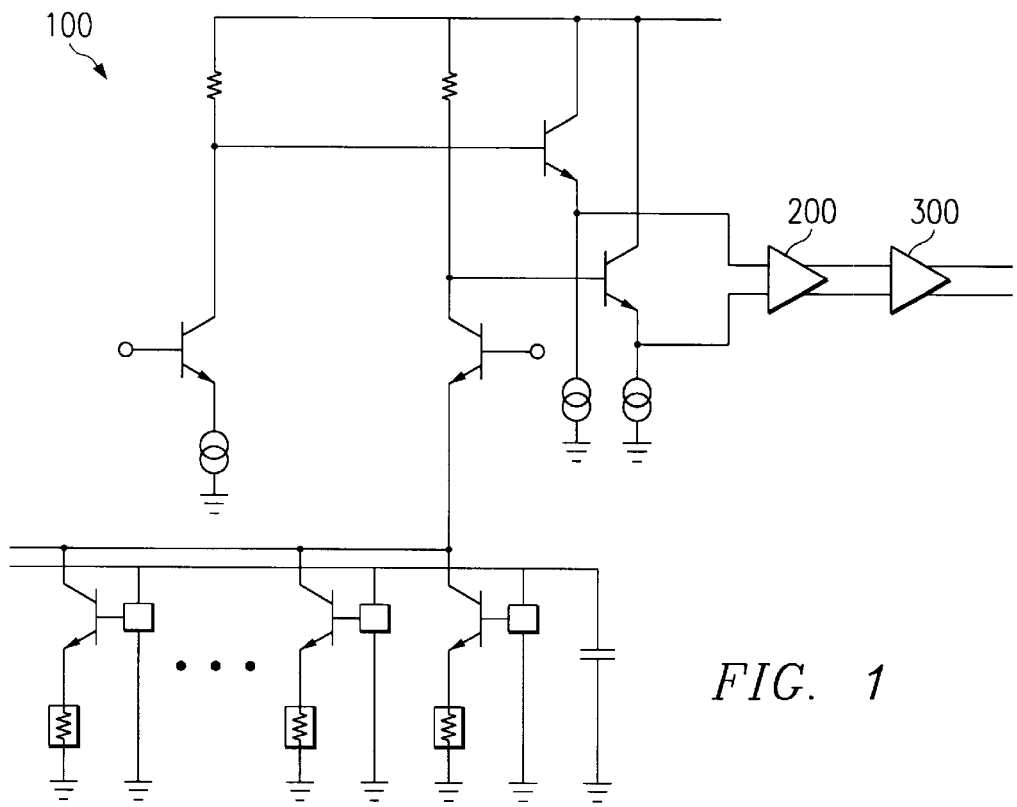
FIG. 1 is an illustrative embodiment of a multi-stage amplifier circuit.

For purposes of illustration, FIGS. 1 through 4 depict the present invention in conjunction with a multi-stage, differential amplifier circuit system. Referring now to FIG. 1, an illustrative multi-stage amplifier is shown. A first amplifier stage 100 couples to a second amplifier stage 200; which in turn couples to a third amplifier stage 300. First stage 100 is depicted in greater detail in FIG. 2.

Figure 2:
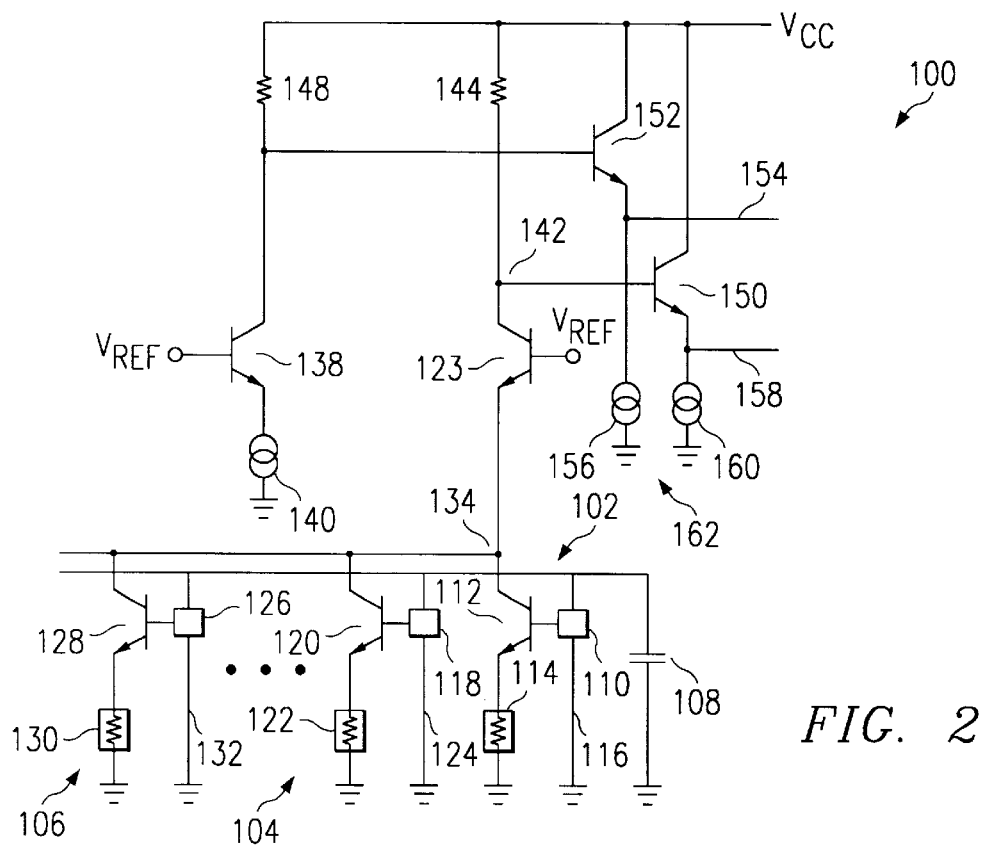
FIG. 2 is an illustrative embodiment of a first stage of the amplifier circuit depicted in FIG. 1, incorporating circuitry for negating the effects of capacitive loading on the amplifier circuitry.

Referring now to FIG. 2, first stage 100 is shown in detail. Specialized input circuitry comprising input elements 102, 104, and 106 coupled selectably to capacitor 108 is shown. This input circuitry provides a user the ability to select from a plurality of electrical signals for input to first stage 100. Input element 102 may be switchably coupled to capacitor 108 by switchable circuit 110. Circuit 110 couples to the base of transistor 112. The emitter of transistor 112 is coupled to one end of signal source 114; which is coupled at its other end to ground. When input from signal source 114 is desired for use in the amplifier circuit system, a user employs switchable circuit 110 to couple the base of transistor 112 to capacitor 108. When input from signal source 114 is not desired for use in the amplifier circuitry, switchable circuit 110 couples the base of transistor 112 to ground via lead 116.

Input elements 104 and 106 function similar to input element 102. Input element 104 comprises switchable circuit 118 coupled to the base of transistor 120. The emitter of transistor 120 couples to one end of signal source 122; which is coupled at its other end to ground. Switchable circuit 118 alternatively couples the base of transistor 120 to either capacitor 108, or to ground via lead 124. Input element 106 comprises switchable circuit 126 coupled to the base of transistor 128. The emitter of transistor 128 couples to one end of signal source 130; which is coupled at its other end to ground. Switchable circuit 126 alternatively connects the base of transistor 128 to either capacitor 108, or to ground via lead 132.

The collectors of transistors 112, 120, and 128 are coupled together at node 134. This configuration and use of the switchable circuitry allows for a multiplexing of input elements. While any single input element (102, 104, or 106) is selected for use, the remaining input elements may be inactivated. Any number of input elements may thus be coupled.

The emitter of transistor 136 is also coupled to node 134. Transistor 136 has its base coupled to a reference voltage. Similarly, transistor 138 has its base coupled to a reference voltage as well. The emitter of transistor 138 couples to one end of current source 140; which at its other end is coupled to ground.

The collector of transistor 136 is coupled to one end of lead 142. Also coupled to one end of lead 142 is a first end of resistor 144. A second end of resistor 144 couples to $V_{cc}$. Similarly, the collector of transistor 138 is coupled to one end of lead 146. A first end of resistor 148 is also coupled to one end of lead 146; with a second end of resistor 148 coupled to $V_{cc}$. Lead 142 couples at its other end to the base of transistor 150. Lead 146 couples at its other end to the base of transistor 152. The emitter of transistor 152 couples jointly to one end of lead 154 and to a first end of current source 156. A second end of source 156 is couples to ground. The collector of transistor 152 couples to $V_{cc}$. Transistor 150 has its collector coupled to $V_{cc}$ as well. The emitter of transistor 150 couples jointly to one end of lead 158 and to a first end of current source 160. A second end of current source 160 couples to ground. Stage buffer circuitry 162 comprises transistors 150 and 152 and current sources 156 and 160.

Figure 3:
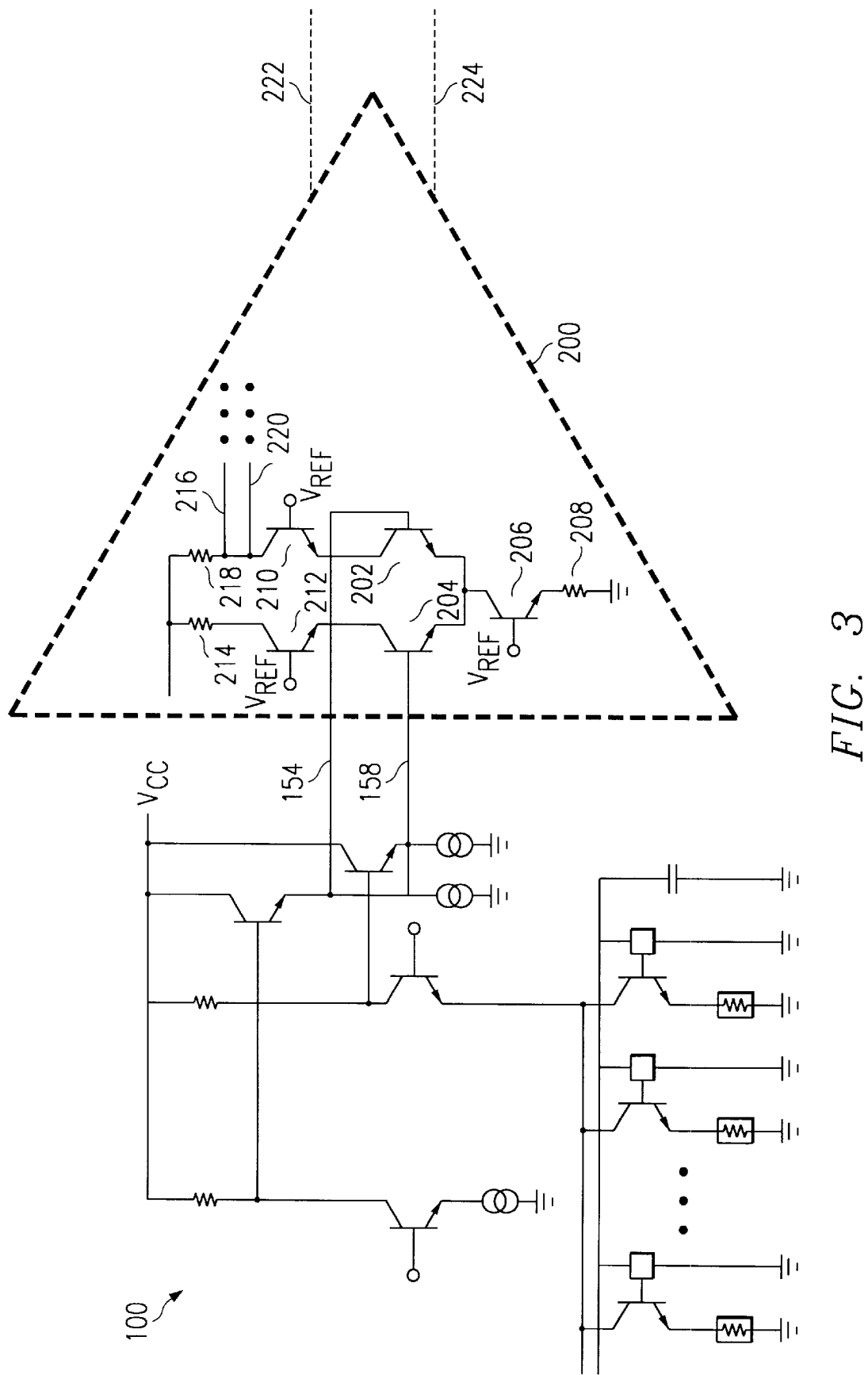
FIG. 3 is an illustrative embodiment of a first stage, as depicted in FIG. 2, and an exemplary portion of a second amplifier stage interconnected, incorporating circuitry for reducing the effects of capacitive loading on the amplifier circuitry.

Leads 154 and 158 couple first stage 100 to second amplifier stage 200 as depicted in FIG. 3. Referring now to FIG. 3, an illustrative connection of first stage 100 with an exemplary sub-portion of second stage 200 is shown. Lead 154 couples to the base of transistor 202, as lead 158 couples to the base of transistor 204. The emitters of transistors 202 and 204 are jointly coupled together with the collector of transistor 206. Transistor 206 has its base coupled to a reference voltage, and its emitter coupled to a first end of resistor 208. Resistor 208 has its second end coupled to ground. The collectors of transistors 202 and 204 are coupled to the emitters of transistors 210 and 212, respectively. Transistors 210 and 212 have their bases coupled to a reference voltage. The collector of transistor 212 along with a first end of resistor 214 is coupled to one end of lead 216. Resistor 214 is coupled at its second end to $V_{cc}$. Similarly, resistor 210 has its collector coupled together with a first end of resistor 218 to one end of lead 220. Resistor 218 is coupled at its second end to $V_{cc}$. Leads 216 and 220 connect to subsequent circuitry within second stage 200, not shown here. Leads 222 and 224 transfer output of second stage 200, and couple stage 200 to third amplifier stage 300.

Figure 4:
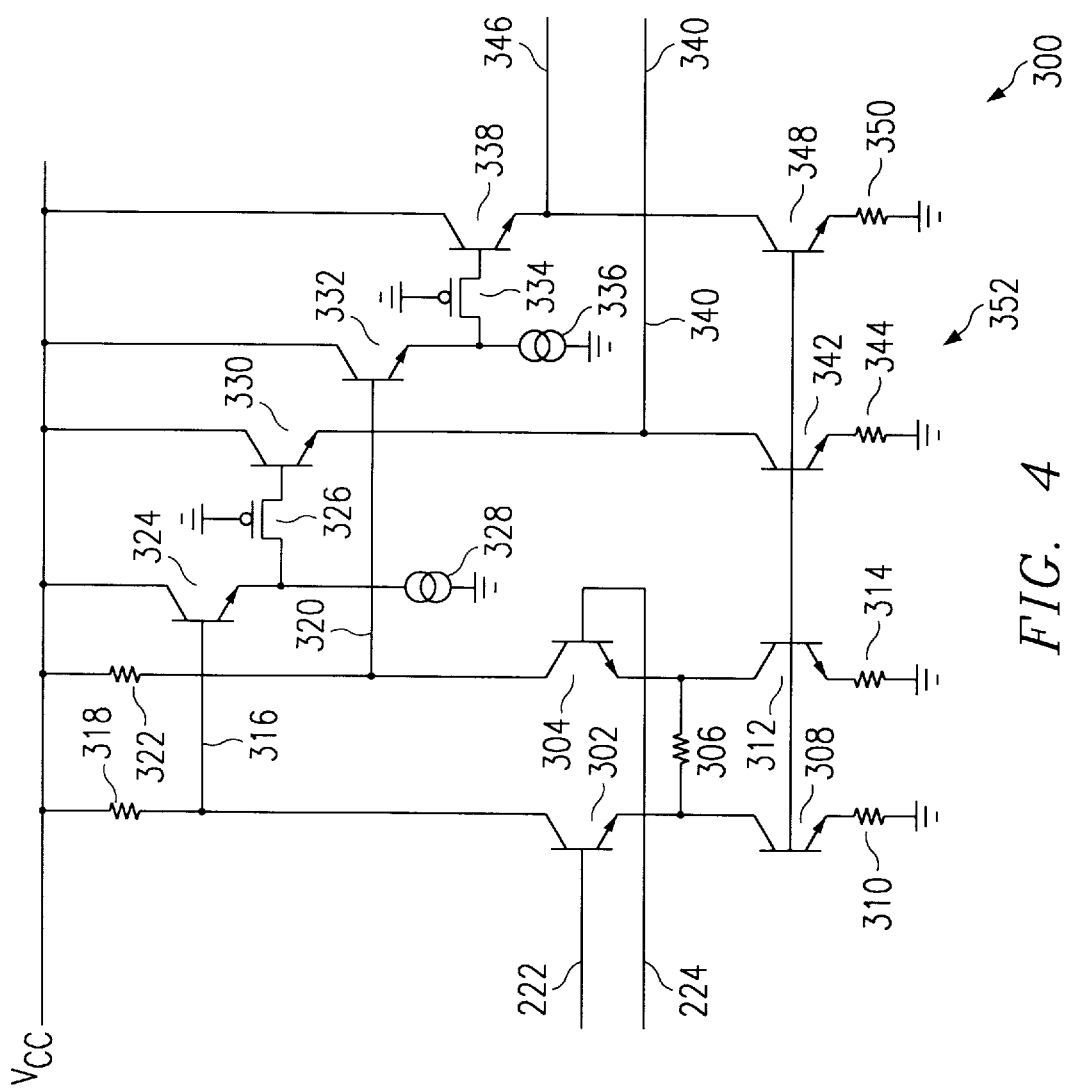
FIG. 4 is an illustrative embodiment of a third stage of an amplifier circuit incorporating circuitry for reducing the effects of capacitive loading on the amplifier circuitry.

Referring now to FIG. 4, lead 222 couples to the base of transistor 302, as lead 224 couples to the base of transistor 304. The emitter of transistor 302 couples jointly to a first end of resistor 306 and to the collector of transistor 308. The emitter of transistor 308 couples to a first end of resistor 310, which is coupled at its second end to ground. The base of transistor 308 couples to a reference voltage. The emitter of transistor 304 couples jointly to a second end of resistor 306 and to the collector of transistor 312. Transistor 312 also has its base coupled to a reference voltage. The emitter of transistor 312 couples to a first end of resistor 314, which is coupled at its second end to ground. The collector of transistor 302 couples jointly to one end of lead 316 and to a first end of resistor 318. Resistor 318 couples at its second end to $V_{cc}$. The collector of transistor 304 couples jointly to one end of lead 320 and to a first end of resistor 322. A second end of resistor 322 couples to $V_{cc}$. A second end of lead 316 couples to the base of transistor 324. The emitter of transistor 324 couples jointly to a first end of field effect transistor (FET) 326, and to a first end of current source 328. A second end of current source 328 couples to ground; while a second end of FET 326 couples to the base of transistor 330. A second end of lead 320 couples to the base of transistor 332. The emitter of transistor 332 is coupled jointly to a first end of FET 334, and to a first end of current source 336. A second end of current source 336 couples to ground, while a second end of FET 334 couples to the base of transistor 338. The emitter of transistor 330 couples jointly to one end of lead 340 and to the emitter of transistor 342. The base of transistor 342 couples to a reference voltage, while the collector of transistor 342 couples to a first end of resistor 344. A second end of resistor 344 couples to ground. The emitter of transistor 338 couples jointly to one end of lead 346 and to the collector of transistor 348. The base of transistor 348 couples to a reference voltage; while the emitter of transistor 348 couples to a first end of transistor 350. A second end resistor 350 couples to ground. Output buffer circuitry 352 comprises transistors 330, 338, 342, and 348 and resistors 344 and 350.

Referring now generally to FIGS. 1 through 4, the present invention provides enhanced operating bandwidth for the amplifier circuit system by negating the effects of capacitive loading within the amplifier circuit system.

The amplifier circuit as depicted in FIGS. 2 through 4, operates to: allow a user to select a desired input element using switchable circuits 110, 118, or 126; receive an electrical signal from the signal source of the selected input element; perform single ended to differential conversion and amplification in first stage 100; perform amplification in second stage 200; perform amplification and output a different electrical signal in third stage 300.

Functionally, an electrical signal is received in first stage 100 from one of the input elements in a single ended format. A designer selects which input element the electrical signal will be received from by activating that input element's switchable circuit; such that the switchable circuit couples the base of that input element's transistor to capacitor 108. The switchable circuits for the remaining input elements couple the bases of those respective transistors to ground. Thus, only one input element is activated at a time.

For the input element selected, an electrical signal is received from the signal source. The electrical signal is amplified by the combination of the input element transistor and transistor 136, and is converted from a single ended format to a differential format. Multiplexing the input elements at node 134 results in the transistor within the active input element pairing with transistor 136 in a cascode amplifier configuration. This reduces the effects of Miller effect capacitance of the transistors; and thus the operational bandwidth of the amplifier circuit system is not impacted by this capacitance. This results in an enhancement of the amplifier circuitry's operational bandwidth. The now differential electrical signal transfers through stage buffer circuitry 162, to leads 154 and 158. Leads 154 and 158 transmit the differential signal to second stage 200. Stage buffer circuitry 162 negates the transitive capacitive effects of stage 200 on first stage 100. The example of buffer circuitry 162 illustrated in FIG. 2 is an emitter follower combination of transistors 152 and 150.

The circuitry of first stage 100 is thus effectively isolated from the capacitive effects of second stage 200 and of the input circuitry; and therefore operational bandwidth of first stage 100 is not affected.

A buffer circuit comparable to buffer 162 may be similarly employed in second stage 200 to isolate stage 200 from capacitive loading originating in subsequent amplifier stages.

The differential electrical signal is further amplified by second stage 200. Leads 222 and 224 transmit the now amplified electrical signal from second stage 200 to third stage 300.

The electrical signal may be once again amplified by third stage 300 before being output to leads 340 and 346. Buffer circuitry 352 is implemented in third stage 300 to isolate the amplification circuitry of third stage 300 from capacitive effects arising from output or loading circuitry on leads 340 and 346. Again in this example, the buffer circuitry 352 illustrated in FIG. 4 is an emitter follower combination.

The combination of buffer circuitry employed stages 100, 200, and 300 provides an effective isolation for each amplifier stage from capacitive loading effects of subsequent and previous amplifier stages. This buffering and isolation results in an overall enhancement in the operational bandwidth of the amplifier circuit system.

As will be apparent to those skilled in the arts, input elements 102, 104, and 106 may be implemented in a number of ways. This illustration of the present invention provides the input buffer circuitry by means of forming a cascode amplifier combination between transistor 136 and the operational transistor of the selected input element. Other input buffer circuitry implementations may be desired and implemented by the user. Various embodiments for the buffering and selection of the input circuitry will be apparent to those skilled in the art, and are comprehended by the present invention.

One embodiment of the buffering circuits 162 and 352 comprises configuring these elements in an emitter follower combination. As design requirements dictate, other suitable contrivances known in the art may be used as buffering elements. Any suitable buffering elements providing isolation from transitive capacitive effects of collateral circuitry may be employed depending on desired operational characteristics, and all such possibilities are comprehended by the present invention.

It will also be readily apparent to those skilled in the art that a number of switchable circuits 110, 118, and 126 may be employed and utilized within the amplifier circuit system. The embodiments illustrated in FIGS. 1, 2 and 3 are shown generically. Any suitable circuitry providing a user with switchable capability may be implemented by the user. All such combinations are comprehended by the present invention.

While this invention has been described and referenced to the illustrative embodiments, this description is not intended to be construed in a limiting sense. Various modifications and combinations of the illustrative embodiments, as well as other embodiments of the invention, will be apparent to persons skilled in the art upon reference to this description.

It is therefore intended that the appended claims encompass any such modifications or embodiments.

What is claimed is:

1. Circuitry for increasing bandwidth of high frequency amplification of electrical signals comprising:
    input circuitry adapted to selectably receive one of a plurality of electrical signals;
    buffer circuitry coupled to said input circuitry and adapted to isolate capacitive loading originating from said input circuitry while transmitting said one electrical signal; and
    amplification circuitry for amplifying said one electrical signal coupled to said buffer circuitry, and adapted to output an amplified electrical signal.

2. The circuitry of claim 1 wherein said amplification circuitry is adapted to couple to distinct output circuitry for outputting said amplified electrical signal to said output circuitry.

3. The circuitry of claim 2 further comprising additional buffer circuitry coupled to said amplification circuitry, and adapted to negate capacitive loading on said amplification circuitry originating from said distinct output circuitry.

4. The circuitry of claim 1 wherein said amplification circuitry further comprises a first amplification stage and a second amplification stage.

5. The circuitry of claim 4 wherein said first amplification stage in coupled to said buffer circuitry.

6. The circuitry of claim 4 wherein said second amplification stage is adapted to couple to distinct output circuitry for outputting said amplified electrical signal to said output circuitry.

7. The circuitry of claim 6 further comprising additional buffer circuitry coupled to said second amplification stage, and adapted to negate capacitive loading on said second amplification stage originating from said distinct output circuitry.

8. The circuitry of claim 4 further comprising additional buffer circuitry coupled between said first and second amplification stages and adapted to negate capacitive loading on said first amplification stage originating from said second amplification stage.

9. The circuitry of claim 8 wherein said second amplification stage is adapted to couple to distinct output circuitry for outputting said amplified electrical signal to said output circuitry.

10. The circuitry of claim 9 further comprising additional buffer circuitry coupled to said amplification circuitry, and adapted to negate capacitive loading on said amplification circuitry originating from said distinct output circuitry.

11. A method of increasing bandwidth in an amplification circuit comprising the steps of:
    providing an amplification circuit for amplifying an electrical signal;
    providing buffer circuitry adapted to negate capacitive loading on first couple circuit originating from a second coupled circuit;
    providing a collateral circuit to be coupled to said amplification circuit; and
    coupling said buffer circuitry between said amplification circuit and said collateral circuit such that said buffer circuitry isolates said amplification circuit from capacitive loading originating from said collateral circuit.

12. The method of claim 11 wherein the step of providing a collateral circuit further comprises providing an input circuit adapted to selectably receive one of a plurality of electrical signals.

13. The method of claim 11 wherein the step of providing a collateral circuit further comprises providing circuitry for outputting said electrical signal.

14. The method of claim 11 wherein said step of providing an amplification circuit further comprises providing a first and second amplification stage.

15. The method of claim 14 further comprising the step of providing second buffer circuitry coupled between said first and second amplification stages and adapted to negate capacitive loading on said first amplification stage originating from said second amplification stage.

* * * * *